(12) United States Patent
Curatolo et al.

(10) Patent No.: US 7,233,514 B2
(45) Date of Patent: Jun. 19, 2007

(54) NON-VOLATILE SEMICONDUCTOR MEMORY AND METHOD FOR READING A MEMORY CELL

(75) Inventors: Giacomo Curatolo, Dresden (DE); Carlo Borromeo, Dresden (DE)

(73) Assignee: Infineon Technologies Flash GmbH & Co. KG, Dresden (DE)

( * ) Notice: Subject to any disclaimer, the term of this patent is extended or adjusted under 35 U.S.C. 154(b) by 123 days.

(21) Appl. No.: 11/200,504

(22) Filed: Aug. 9, 2005

(65) Prior Publication Data
US 2007/0035992 A1    Feb. 15, 2007

(51) Int. Cl.
*G11C 17/00* (2006.01)
(52) U.S. Cl. ............. 365/100; 365/185.05; 365/185.13
(58) Field of Classification Search ................ 365/100, 365/185.13, 185.05, 185.25, 189.09
See application file for complete search history.

(56) References Cited

U.S. PATENT DOCUMENTS 5,717,636 A * 2/1998 Dallabora et al. ..... 365/185.13
6,262,914 B1 * 7/2001 Smayling et al. ...... 365/185.11
2001/0021126 A1   9/2001 Lavi et al.
2006/0146614 A1 * 7/2006 Lue et al. .............. 365/185.28

* cited by examiner

*Primary Examiner*—Gene N. Auduong
(74) *Attorney, Agent, or Firm*—Slater & Matsil, L.L.P.

(57) ABSTRACT

A method for reading a memory cell, wherein the memory cell comprises two source/drain regions and a gate, wherein the source/drain regions are each connected to a respective local bitline, and, wherein one of the source/drain regions of a neighboring memory cell is connected to one of the local bitlines, the other source/drain region of the neighboring memory cell being connected to another local bitline, comprising the steps of connecting the local bitline that connects the source/drain region of the memory cell and the source/drain region of the neighboring memory cell to a first global bitline, connecting the local bitline that connects the other source/drain region of the memory cell to a second global bitline, connecting the local bitline that connects the other source/drain region of the neighboring memory cell to one of a plurality of local power rails, applying a gate potential to the gate of the memory cell, applying a potential to the first global bitline and applying another potential to the second global bitline, and measuring the current flowing through the first global bitline.

24 Claims, 5 Drawing Sheets

NON-VOLATILE SEMICONDUCTOR MEMORY AND METHOD FOR READING A MEMORY CELL

TECHNICAL FIELD

The present invention relates to a non-volatile semiconductor memory and to a method for reading a memory cell in such a memory in such a manner that the neighbor effect is minimized.

BACKGROUND

FIG. 1 shows a portion of a semiconductor memory comprising memory cells MC arranged in a so called "virtual ground array." The gates G of memory cells MC arranged along rows are connected by the same wordline WL. The source/drain regions SD of memory cells MC arranged along columns are connected to the same local bitlines LB, with each local bitline LB being shared by memory cells MC in two adjacent columns of the array in order to reduce chip area. Each local bitline LB is connected to a total of 512 memory cells MC while each wordline WL is connected to the gates G of 512 memory cells MC. The memory cells MC are nitride read-only memory (NROM) cells, which are non-volatile. NROM cells can store two bits per cell in a nitride layer. The ability to store two bits per cell is indicated in the schematic of each memory cell MC by two "x". The combination of NROM cells with virtual ground arrays allows the design of memories with high storage densities.

In order to select memory cells MC for reading, each local bitline LB can be connected to one of the global bitlines GB by means of a respective switching element S1. The global bitlines GB are connected to column decoders (not shown) and the wordlines WL to row decoders (not shown). Potentials applied to the global bitline GB selected by the column decoder and to the wordline WL selected by the row decoder are then passed on to the source/drain regions SD and the gate G of the memory cell MC to be read. The state stored in the memory cell MC can be determined by sensing the current flowing through the memory cell MC in a sense amplifier.

To minimize the chip area required for the semiconductor memory, the local bitlines LB are alternately connected to top and bottom global bitlines GB, with six local bitlines LB being connectable to each global bitline GB. For ready reference, a switching unit SU comprising switching elements S1, part of a global bitline GB and parts of local bitlines LB is shown.

FIG. 2 shows the layout of a switching unit SU. Six local bitlines LB are connected by means of local bitline contacts CL to diffusion zones in a semiconductor substrate SB. Further shown is a global bitline GB which is connected to further diffusion zones in the semiconductor substrate SB by means of global bitline contacts CG. Global bitline select lines SG are arranged between each local bitline contact CL and the global bitline contact CG, which is closest to the respective local bitline contact CL.

Each combination of a local bitline contact CL, its closest global bitline contact CG and the global bitline select line SG between the two contacts forms a transistor. The gate of the transistor is connected by the global bitline select line SG and the source/drain regions of the transistor are connected by the local bitline contact CL and the global bitline contact CG, respectively. If a potential greater than the threshold potential of the transistor formed is applied to the global bitline select line SG, then the local bitline LB connected by the local bitline contact CL is connected to the global bitline GB connected by the global bitline contact CG. The transistor is thus an implementation of one of the switching elements S1 shown in FIG. 1 and, because it is used to select a bitline, is commonly known as select transistor.

The technology that is used to manufacture the semiconductor memory determines the smallest pitch, that is, the smallest distance between lines, that is possible. The size of the memory cells MC determines the pitch of the layout, and as each memory cell MC is directly connected by the respective local bitlines LB, this pitch is also the pitch for the local bitlines LB.

The local bitlines LB cannot be directly connected to the sense amplifier as they are too small and too resistive. Therefore, another metallization layer with global bitlines GB is introduced. The global bitlines GB are thick metal layers of low resistance and are used to connect the local bitlines to the sense amplifier. However, because of the larger pitch of the global bitlines GB, it is not possible to connect all of the local bitlines LB to different global bitlines GB. Rather, each of the global bitlines GB has to be shared by six local bitlines LB, so that it is not possible to control each of the local bitlines LB individually without using complicated architectures or decoding mechanisms.

FIG. 3 is used to illustrate an effect known as "neighbor effect" which occurs when a local bitline LB is shared between two memory cells connected by the same wordline WL. For the sake of clarity, only one row having three memory cells is shown. However, it is clear that the cells can be extended to the left and right as well as to the top and bottom as shown in FIG. 1. In addition to the elements already described in conjunction with FIG. 1, a sense amplifier SA connected to the first global bitline GB1 and to the second global bitline GB2, is shown.

In FIG. 3, memory cell MC is selected for reading by closing the switching elements S1 of the local bitlines LB connecting the source S and drain D of the memory cell MC. As a result, these local bitlines LB are connected to the first global bitline GB1 and the second global bitline GB2, respectively. The local bitlines LB of the neighboring memory cell NC and the further memory cell FC, which are not shared with the memory cell MC, are not connected to the global bitlines GB1 and GB2. A current IS will flow through the memory cell MC if suitable potentials VS and VD are applied to the first global bitline GB1 and to the second global bitline GB2, respectively. An erased memory cell MC allows a higher current IS to flow than a programmed cell, so that the state stored in the memory cell MC can be determined by measuring the current IS flowing through it.

Ideally, the current IM flowing into the sense amplifier SA is equal to the current IS flowing through the memory cell MC. However, if a neighboring cell NC is connected to the same local bitline LB as the memory cell MC, some of the current IS flowing through the memory cell MC will leak through the neighboring memory cell NC. This current IN will depend on the state stored in the neighboring cell MC and may flow even when no potential is applied to the gate of the neighboring cell NC. Current may, therefore, leak through all the memory cells that are connected to the same local bitline LB, so that the total leakage current maybe as large as 10 to 30% of the current IS flowing through the memory cell MC.

In FIG. 3, the current IS flowing out of the source S of the memory cell MC is to be measured. This is referred to as source-side sensing. It is also possible to measure the current ID flowing out of the drain D of the memory cell MC. This is known as drain-side sensing and the current flowing into the second global bitline GB2 is measured. If a current IF flows through the further memory cell FC leakage will also occur in drain-side sensing, adulterating the current measured.

As a consequence of the leakage due to the neighbor effect, the current IM measured in the sense amplifier SA is less than the current IS or ID flowing through the memory cell MC. If the leakage current is great enough, then the current IM measured may be decreased to such an extent that a programmed memory cell MC is mistakenly read as an erased cell. This will lead to reading failure of the memory as data cannot be correctly retrieved. There is, therefore, a need to reduce the leakage due to the neighbor effect as much as possible.

In prior art, the neighbor effect problem has been partially solved by charging or discharging the local bitlines LB and the global bitline GB before each read operation.

In source-side sensing, all bitlines, global and local, are pre-discharged to the same value as the potential VS applied to the first global bitline GB1 for reading, which typically is 0 V. As a result, the voltage across the source and drain of neighboring cells is approximately zero so that no current flows through the neighboring cells. For drain-side sensing, all the bitlines, global and local, are pre-charged to the same value as the potential VD applied to the second global bitline GB2 for reading, which typically is the supply potential. The switching elements S1 connecting the local bitlines LB of memory cells, which are not to be read, are opened after the pre-charging or pre-discharging.

However, when reading the memory cell MC, voltage drops of 100 mV to 300 mV occur, depending on the state stored in the memory cell MC, so that the neighboring cells also display a potential difference of the same magnitude across source and drain. As a result, a small leakage current will still flow. With reductions in structure sizes the resistance in the path for the current IS will increase and larger voltage drops will occur, leading to more leakage. The pre-charge/pre-discharge solution of the prior art, therefore, fails to completely solve the problems of the neighbor effect.

Besides failing to totally solve the leakage problem, the charge/discharge operations increase the power consumption of the semiconductor memory as all the global and local bitlines must be charged or discharged. A further disadvantage is that the time required for reading the memory cells is increased as the charge/discharge operation must be performed before each read operation and due to the RC time constants involved this takes a certain time.

Prior art also suggests connecting further global bitlines GB at different potentials to the neighboring cells in order to reduce the neighbor effect. However, providing biased potentials is difficult and these solutions usually require complicated interleaved bitline architectures with large increases in the chip area in order to be able to control the potentials of the local bitlines LB independently from each other. Additionally, the global bitlines GB must still be charged and discharged before each read operation, thus increasing the power consumption of the memory.

SUMMARY OF THE INVENTION

In one aspect, the present invention provides an improved method for reducing the leakage due to the neighbor effect. In a further aspect the present invention reduces the power consumption and the chip area required for reducing the neighbor effect. In still a further aspect, the present invention is able to control the potentials of the local bitlines independently from each other.

In preferred embodiments, a method is provided for reading a memory cell. The memory cell typically comprises two source/drain regions and a gate. The source/drain regions are each connected to a respective local bitline, such that one of the source/drain regions of a neighboring memory cell is connected to one of the local bitlines and the other source/drain region of the neighboring memory cell is connected to another local bitline. The local bitline that connects the source/drain region of the memory cell and the source/drain region of the neighboring memory cell is coupled to a first global bitline. The local bitline that connects the other source/drain region of the memory cell is coupled to a second global bitline. The local bitline that connects the other source/drain region of the neighboring memory cell is coupled to one of a plurality of local power rails. A gate potential is applied to the gate of the memory cell. A potential is applied to the first local bitline and another potential is applied to the second global bitline. The current flowing through the first global bitline can be measured.

In contrast to prior art, the local bitline of the neighboring cell, which is not shared with the memory cell to be read, is coupled to a local power rail. The potential of the local power rail is chosen so that the voltage across the source and drain of the neighboring memory cell is reduced, thus reducing the neighbor effect. The advantage of using local power rails to control the potential of the local bitlines is that neither complicated decoding for selecting the local bitlines nor multiple global bitlines are required.

Preferably, the potential of the local power rail is kept at a fixed level. In contrast to prior art, no charging or discharging of the local power rail is required, thus reducing the power consumption and reducing the time required for reading a memory cell.

Preferably, the potential of the local power rail is based on the potential applied to the first global bitline. By choosing the potential of the local power rail to be equal to the potential applied to the first global bitline, the voltage across the source and drain of the neighboring memory cells can be reduced to nearly zero so that the leakage current is reduced.

Preferably, further memory cells and further local bitlines are connected to the memory cell and the neighboring memory cell to form a virtual ground array, wherein the further memory cell, which has one of its source/drain regions connected to the same local bitline as the memory cell, has its other local bitline, which connects its other source/drain region connected to a local power rail. By connecting the other local bitline of the further memory cell to the local power rail, the leakage current flowing through the further memory cell is reduced, thus reducing the neighbor effect. The virtual ground array has the advantage that a large number of memory cells can be connected together in a space saving manner.

Preferably, all the local bitlines, except for the local bitlines that are already connected to the first global bitline and the second global bitline, are connected to one of the plurality of local power rails. By connecting all the local bitlines of memory cells that are not to be read to one of the local power rails, the leakage current is further reduced. Leakage current cannot only flow through the cells immediately adjacent to the memory cell to be read but also from one neighboring cell to another, or through memory cells in different rows to the row of the memory cell to be read but connected to the same local bitlines as the memory cell to be read.

Embodiments of the invention also provide a non-volatile semiconductor memory that includes a plurality of memory cells connected to a plurality of local bitlines to form a virtual ground array, a plurality of global bitlines, a plurality of first switching elements for connecting each of the local bitlines to one of the global bitlines, a plurality of local power rails, a plurality of second switching elements for connecting the local bitlines to one of the local power rails, and a control unit for controlling the first switching elements and the second switching elements.

By connecting the local bitlines of neighboring cells, which are not shared with the memory cell to be read, to one of the local power rails, the neighbor effect can be minimized.

Preferably, the first switching elements and the second switching elements operate independently from each other. The semiconductor memory may thus be operated in a more flexible way than in the prior art where special decoders are needed or different potentials were applied to a plurality of global bitlines. The local power rails may thus even be used for providing reading potentials, with the second switching elements taking on the function of select transistors. In this way, a local bitline driver can be implemented that bypasses the global bitline. This will result in a very fast reading performance because, instead of charging or discharging global bitlines, only local bitlines with less capacitance need to be charged or discharged and the current path for charging these is very low-ohmic.

Preferably, the control unit operates the first switching elements and the second switching elements so that each of the local bitlines is either connected to one of the global bitlines or to one of the local power rails or is neither connected to a global bitline nor a local power rail. In this way, the neighbor effect can be reduced and no short circuit results from a local power rail being connected to a global bitline and a local power rail at the same time.

Preferably, the control unit operates the first switching elements so that the local bitlines connecting the memory cell that is to be read are connected to two respective global bitlines.

Preferably, the control unit operates the second switching elements so that the local bitlines not connecting the memory cell that is to be read are connected to one of the local power rails.

Preferably, the local power rails are connected to a fixed potential.

Preferably, the fixed potential is related to the potential that is applied to one of the global bitlines connected by the first switching elements while reading a memory cell.

Preferably, the fixed potential is based on the potential of the global bitline through which the current that is measured to determine the state stored in the memory cell is flowing. In this way the current flowing through the memory cell to be read is nearly the same as the current measured in the sense amplifier.

Preferably, the local power rails are formed in the same metallization layer as the local bitlines or wordlines.

Preferably, the local power rails are connected to a wordline decoder. The wordline decoder can then be used to supply a fixed potential to the local power rail.

Preferably, each local power rail comprises a plurality of power rails that are connected in parallel to reduce the electrical resistance of the local power rail.

Preferably, the local power rails are connected by bitlines that are formed in the same layer as the global bitlines. The metallization layer in which the global bitlines are formed has a lower specific resistivity than the metallization layer of the local bitlines or wordlines.

Preferably, each local power rail comprises a plurality of power rails that are connected in parallel by the bitline connecting the local power rail. The bitline formed in the same layer as the global bitlines is used to connect several power rails together to form a local power rail.

Preferably, the bitlines connecting the local power rails are connected to sense amplifiers. The sense amplifiers can then provide a potential to the local power rails. The potential can be the potential that is applied to the global bitlines.

Preferably, the bitlines connecting the local power rails are connected to a bitline decoder. Instead of being directly connected to a sense amplifier, the local power rails are connected to a potential provided by a bitline decoder.

Preferably, the value of the fixed potential depends on whether memory cells are to be read, written or erased. The invention can thus also be used to reduce the impact of similar neighbor effects occurring in reading, writing or erasing operations.

Preferably, the memory cells are nitride read-only memory cells (NROM). NROM cells allow memories with a high storage capacity density to be designed as they are able to store two bits per cell.

BRIEF DESCRIPTION OF THE DRAWINGS

The invention will now be described in more detail below by way of non-limiting examples and with reference to the accompanying drawings, in which.

The following list of reference symbols can be used in conjunction with the figures:

| | |
|---|---|
| CG | global bitline contact |
| CL | local bitline contact |
| CP | power rail contact |
| CU | control unit |
| FC | further memory cells |
| G | gate |
| GB | global bitline |
| GB1 | first global bitline |
| GB2 | second global bitline |
| IF | current flowing through further memory cell |
| IS | current flowing through memory cell |
| IN | current flowing through neighbor cell |
| IM | current measured in sense amplifier |
| LB | local bitline |
| LP | local power rail |
| MC | memory cell |
| NC | neighboring memory cell |
| S1 | first switching elements |
| S2 | second switching elements |
| SB | semiconductor substrate |
| SD | source/drain region |
| SG | global bitline select line |
| SP | local power rail select line |
| SU | select unit |

-continued

| | |
|---|---|
| VD | drain potential |
| VS | source potential |
| VW | wordline potential |

DETAILED DESCRIPTION OF ILLUSTRATIVE EMBODIMENTS

Figure 4:
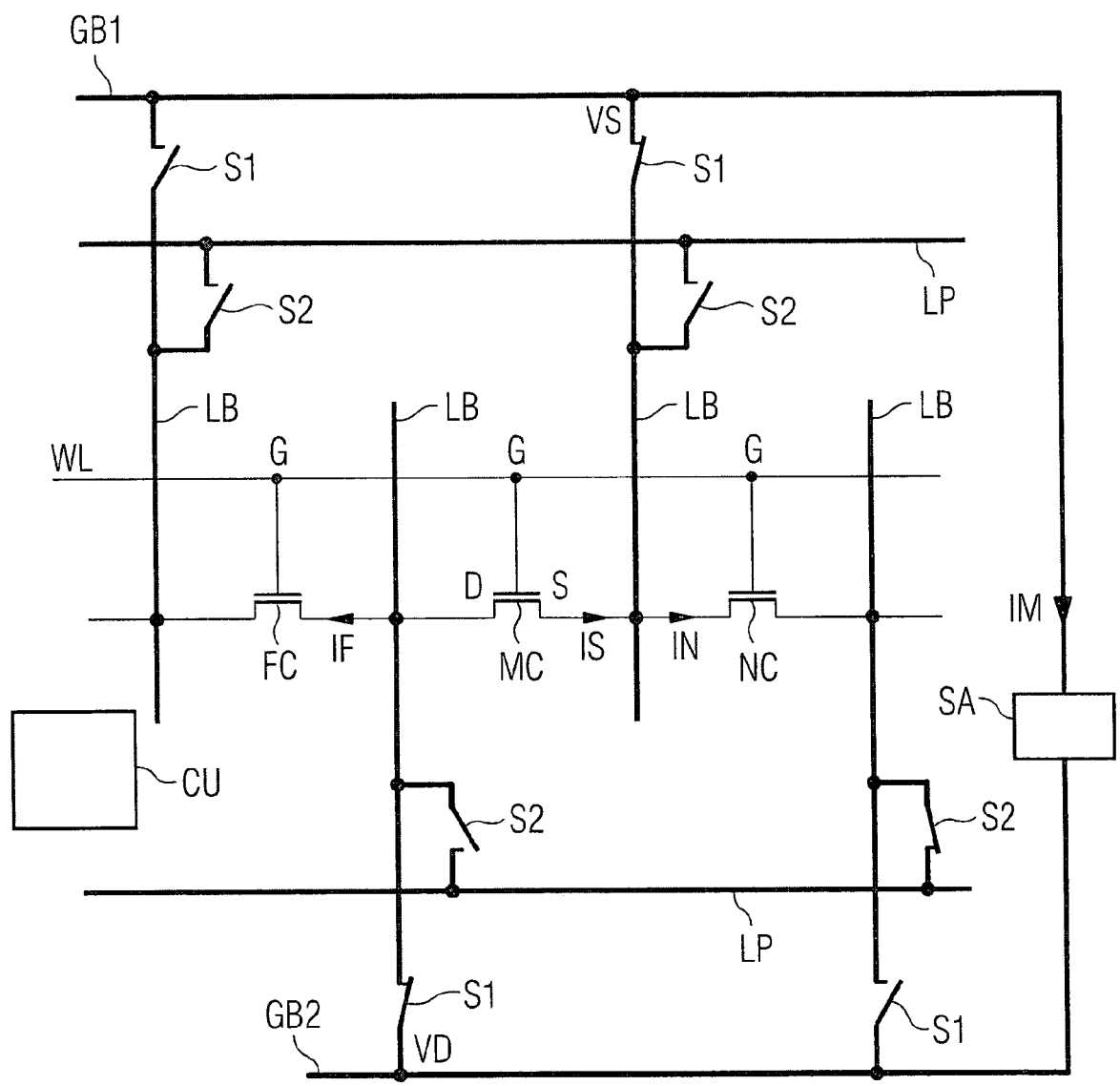
FIG. 4 shows part of a semiconductor memory circuit of an embodiment according to the invention.

FIG. 4 shows part of a semiconductor memory of an embodiment according to the invention. For the purpose of illustration, only the parts necessary for describing the invention are shown. The embodiment can of course be expanded to comprise more memory cells that may be connected together to form a virtual ground array.

There are three memory cells shown in FIG. 4: the memory cell MC, which is to be read; a neighboring memory cell NC; and a further memory cell FC. The source and drain contacts of each memory cell are connected to local bitlines LB, the gate G of each memory cell is connected to the wordline WL. (In this context, the term "connected" refers to elements that are electrically coupled, as opposed to the term "directly coupled," which refers to components that are coupled without intervening components.) One of the local bitlines LB of the memory cell MC is shared with the neighboring memory cell NC and the other local bitline LB of the memory cell MC is shared with the further memory cell FC. Each of the local bitlines LB can be connected by means of a respective first switching element S1 to either one of the global bitlines GB1 or GB2.

The first switching elements S1 connected to the local bitlines LB of the memory cell MC, which is to be read, are shown as closed switches to indicate that these local bitlines LB are connected to one of the global bitlines GB1 and GB2, while the first switching elements S1 connected to the other local bitlines LB are shown as open switches, indicating that there is no connection to the first global bitline GB1 or the second global bitline GB2.

The global bitlines GB1 and GB2 are connected to a sense amplifier SA, which applies the potential VS to the first global bitline GB1 and the potential VD to the second global bitline GB2 and is used for measuring the current IM flowing out of the first global bitline GB1. When a suitable reading potential is applied to the wordline WL a current IS will flow through the memory cell MC. Because of leakage currents to the neighboring memory cell NC and the further memory cell FC the current IM measured in the sense amplifier SA is only approximately equal to the current IS flowing through the memory cell MC.

Also shown in FIG. 4 are local power rails LP. Each of the local bitlines LB can be connected by means of a respective second switching element S2 to one of the local power rails LP. In order to protect the memory cell MC from the neighbor effect, the local bitline LB of the neighbor cell NC that is not shared with the memory cell MC is connected to one of the local power rails LP, as illustrated by a closed switching element S2.

The local power rails LP can be connected to a wordline decoder, in a way similar that the wordlines WL are connected to a wordline decoder. The wordline decoder supplies a fixed potential to the local power rail LP. Alternatively, the local power rails LP can be connected by bitlines that are formed in the same layer as the global bitlines GB. These bitlines are connected to sense amplifiers that provide a potential to the local power rails LP. Alternatively, these bitlines are connected to a bitline decoder, which then provides a potential to the local power rails LP.

The magnitude of the potential of the local power rails LP is based on the potential VS applied to the first global bitline GB1. Ideally, the potential of the local power rails LP is chosen to be equal to the potential of the source S of the memory cell MC out of which the current IS flowing is measured. In this way the voltage drop across the source and drain of the neighboring memory cell NC is equal to 0, so that no current IN will leak out of the neighboring memory cell NC and the current IM measured in the sense amplifier SA is equal to the current IS flowing through the memory cell MC. However, providing a potential equal in magnitude to the potential of the source S of the memory cell MC is difficult due to voltage drops of unknown magnitude in the switching elements S1 and S2 and in the current paths. Further, providing such a biased potential requires a reference potential and a regulating circuit in order to avoid oscillations. For these reasons the potential applied to the local power rails LP is fixed at the potential VS applied to the first global bitline GB1, which usually is a supply potential.

After the current IM has been measured, the local bitlines LB are disconnected from the global bitlines GB1, GB2 and from the local power rails LP.

The first switching elements S1 and the second switching elements S2 are operated by the control unit CU. For clarity's sake the connections between the control unit CU and the first switching elements S1 and second switching elements S2 are not shown. The first switching elements S1 and second switching elements S2 are implemented as MOS-transistors and are located inside the memory array between the memory cells in order to reduce the required chip area. The control unit CU would then control the potential of the gates of the transistors.

By connecting the local bitline LB of the neighboring cell NC to a local power rail LP it is no longer necessary to charge or discharge the global bitlines GB1, GB2 each time before reading a memory cell. The power consumption is reduced and the reading speed increased.

Embodiments of the invention may also be used to protect the memory cell MC from the neighbor effect caused by sharing a local bitline LB with the further memory cell FC. During source-side sensing the current IS flowing out of the memory cell MC is measured so that the current IF leaking through the further memory cell FC is of no significance in determining the correct state stored in the memory cell MC. However, reducing the leakage current IF also reduces the current consumption required for reading the memory cell MC. Also, in the so-called drain-side sensing, where the current flowing out of the drain D of the memory cell MC is measured, the leakage current IF through the further memory cell will affect the current IM measured in the sense amplifier SA. Therefore, the local bitline LB of the further memory cell FC that is not shared with the memory cell MC is connected to one of the local power rails LP by means of one of the second switching elements S2. For drain-side sensing the potential of the local power rail LP should be as close as possible to the potential of the drain D of the memory cell MC. For the reasons outlined above, the potential is chosen to be equal to the potential VD applied to the second global bitline GB2, which usually is a ground potential. Again, the potential difference across the source and drain of the further memory cell FC will be reduced, thus reducing the leakage current IF through the further memory cell FC. As the local power rails LP are held at a fixed potential no charging or discharging is necessary, resulting in a reduction in power consumption.

In a further embodiment, all of the local bitlines LB that are not used for measuring the current IS through the memory cell MC are connected to one of the local power rails LP by means of the second switching elements S2. In this embodiment, this is important as even local bitlines LB connected to memory cells not immediately neighboring the memory cell MC to be read can also contribute to the leakage current. When looking at FIG. 4 it must be remembered that a large number of memory cells are connected to each local bitline LB and that the leakage current will be the sum of leakage currents from all those memory cells. Leakage can occur in memory cells even if no wordline potential is applied to the wordlines WL of these memory cells.

Embodiments of the invention have the advantage that potentials of all the local bitlines LB can be controlled independently from one another without requiring complex decoding architectures or a multitude of global bitlines. The local power rails LP can, therefore, also be used as virtual global bitlines and may be connected to a sense amplifier SA. A memory cell is then selected by closing the second switching element S2 and connecting its local bitlines LB to two of the local power rails LP. This has the advantage that the voltage drops are reduced when compared to the voltage drop of the global bitline. The local bitlines LB are then no longer connected to the global bitlines GB1 and GB2 by means of the first switching elements S1. The global bitlines GB1 and GB2 are bypassed so that only local bitlines LB need to be charged or discharged. As the capacitance of a local bitline LB is only 10 to 15 percent of the capacity of a global bitline GB, the power consumption is reduced even further.

Besides being used for reducing the neighbor effect during reading operations, the invention can also be used to reduce similar effects in write and erase operations.

Figure 5:
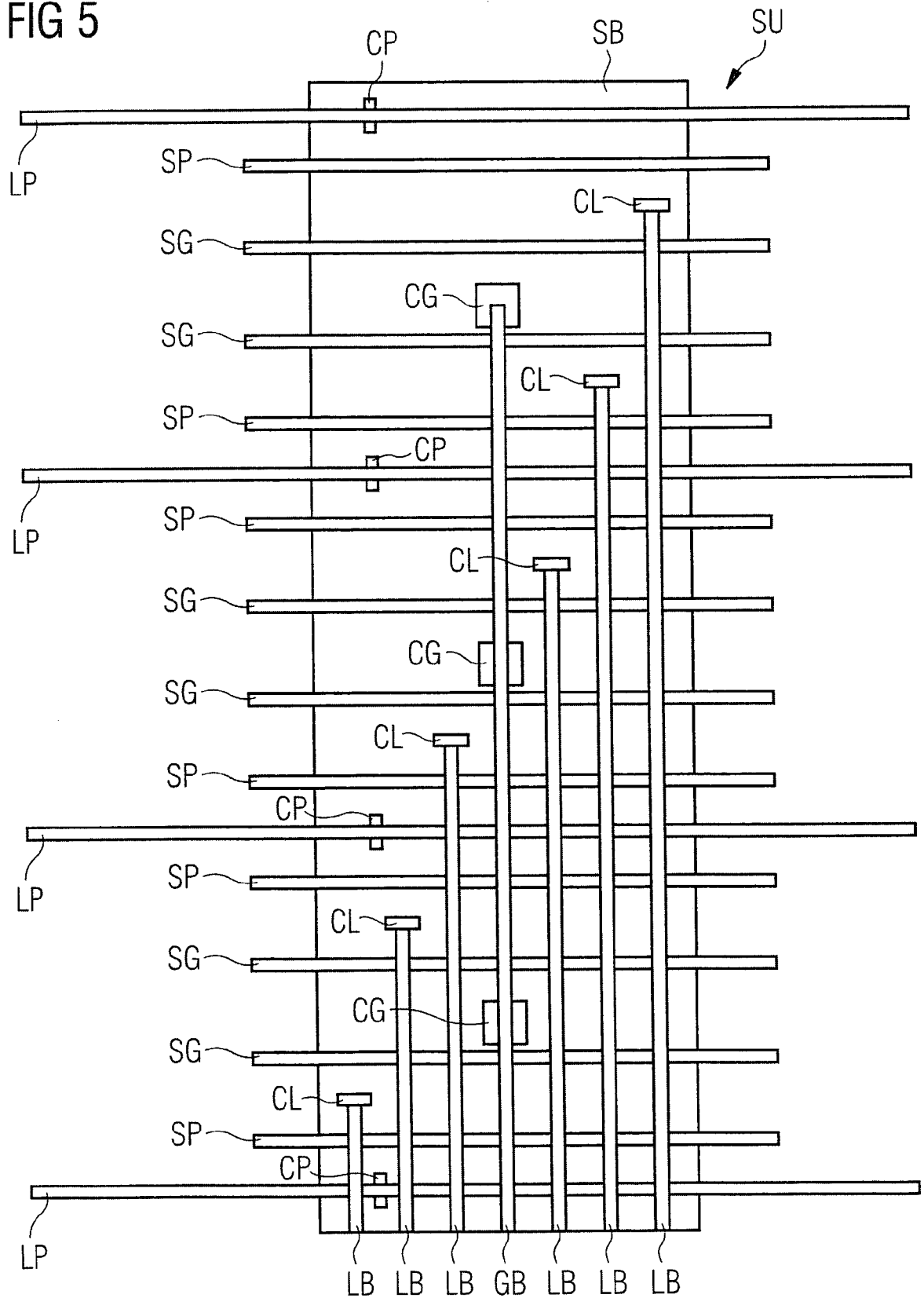
FIG. 5 shows the layout of an embodiment according to the invention.

FIG. 5 shows the layout of a select unit SU for implementing an embodiment according to the invention. Six local bitlines LB are connected by means of local bitline contacts CL to diffusion zones in the semiconductor substrate SB. A global bitline GB is connected by means of the global bitline contacts CG to further diffusion zones in the semiconductor substrate SB.

Figure 1:
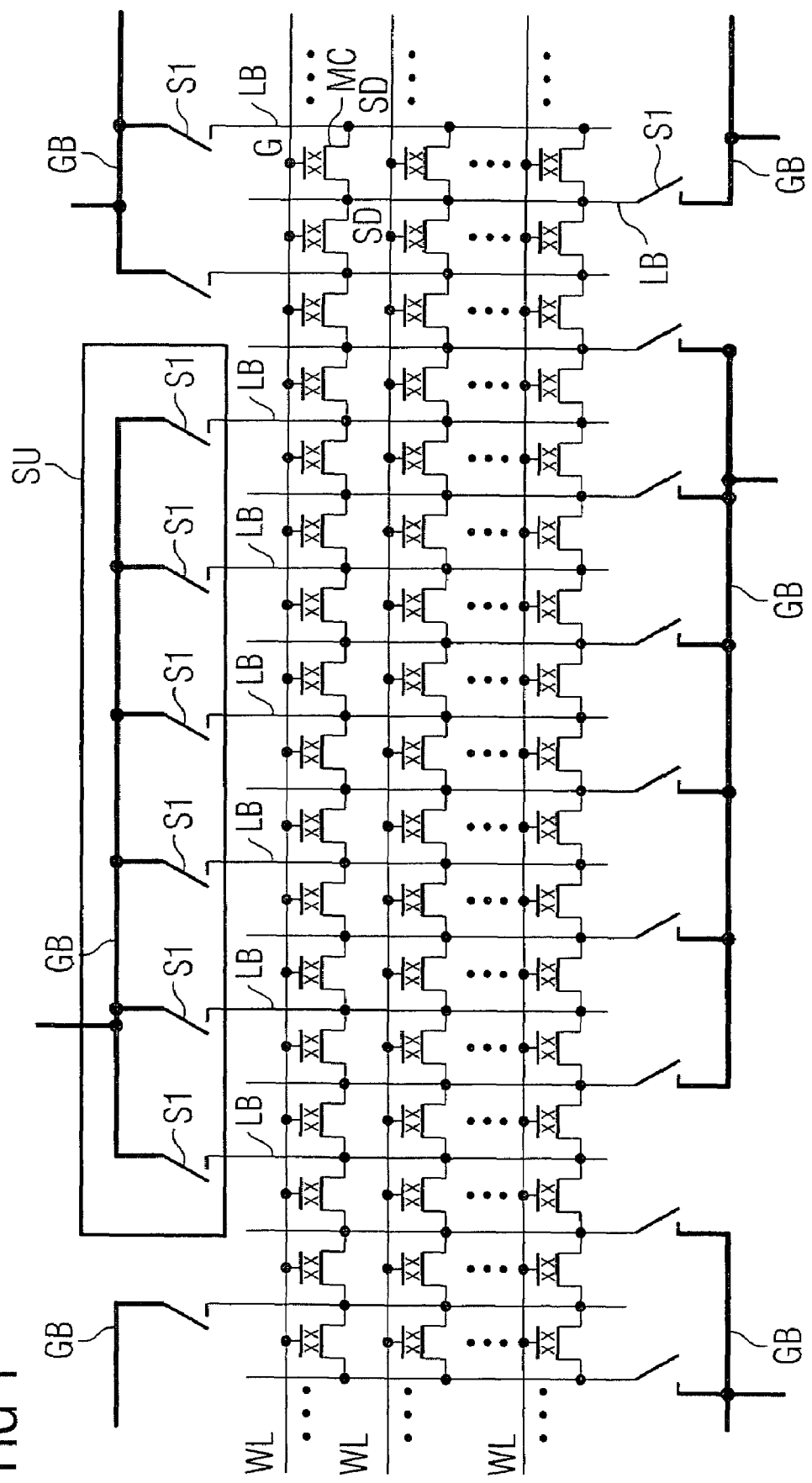
FIG. 1 shows part of a non-volatile semiconductor memory.
Figure 2:
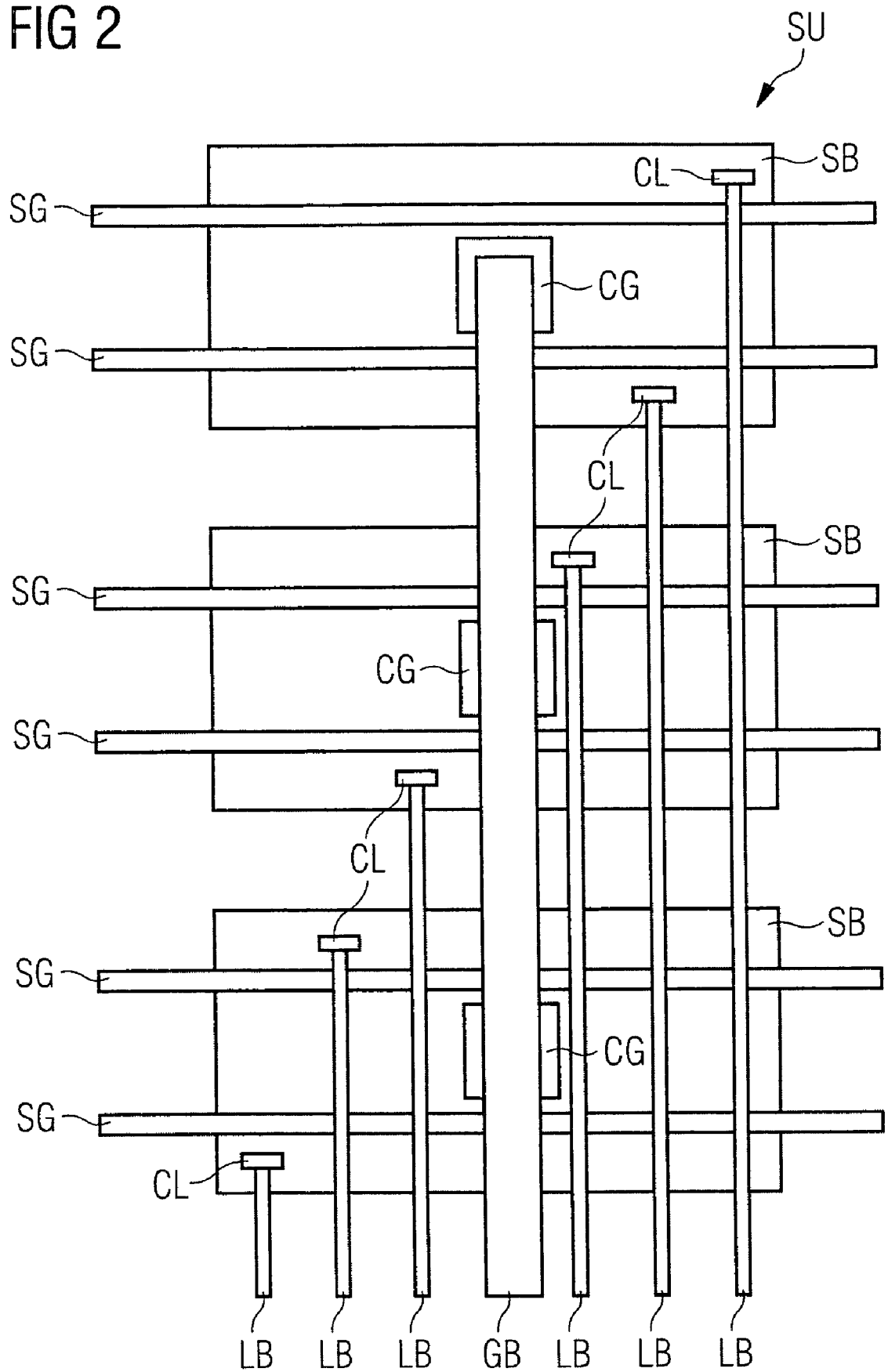
FIG. 2 shows the layout of a select unit.
Figure 3:
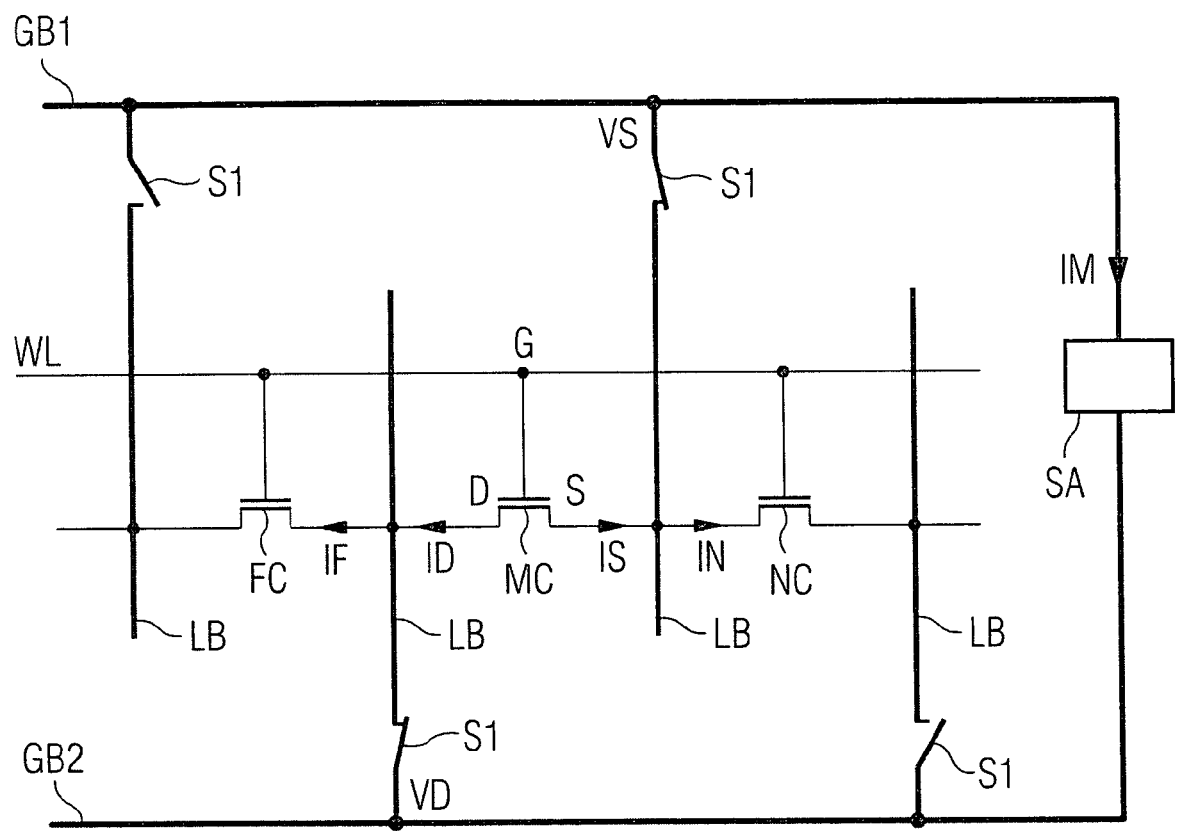
FIG. 3 illustrates the neighbor effect.

As already described in conjunction with FIG. 2 the first switching elements S1 are implemented as transistors. Each of the transistors is formed by a gate that is connected to one of the six global bitlines select lines SG that lies between each pair of local bitline contacts CL and the nearest global bitline contact CG. The local bitlines LB can than be connected to the global bitline GB by applying a suitable potential to the global bitline select line SG.

FIG. 5 also shows an additional four local power rails LP that are connected to still further diffusion zones in the semiconductor substrate SB by means of respective power rail contacts CP. The second switching elements S2 are also implemented as transistors. Six transistors are formed by the six local power rail select lines SP that are arranged between each pair of local bitline contact CP and the nearest local power rail contact CP. When a suitable potential is applied to the local power rail select line SP the corresponding local bitline LB is connected to a corresponding local power rail LP.

The local power rails LP are formed in the same metallization layer as the local bitlines LB or the same metallization layer as the wordlines WL. Each local power rail can be made up of a number of power rails that are connected in parallel. The local power rails LP are then connected to a wordline decoder. The local power rails LP typically have a width of 300 to 500 nm and a length of 3 to 4 mm. The resistivity is about 0.1 Ω/square, where "square" indicates the smallest area available in a given manufacturing technology.

Alternatively, the local power rails LP can be connected by bitlines that are formed in the same layer as the global bitlines GB. These bitlines are then connected to a sense amplifier or a bitline decoder. If each local power rail LP comprises a plurality of power rails, these can be connected in parallel by one of these bitlines each. The bitlines typically have a width of 500 to 600 nm and a length of 3 to 4 mm. The resistivity is about 0.04 Ω/square.

Compared to prior art, the invention has the advantages that it is simple to implement in a space saving manner. There is no need to reduce the global bitline pitch and the required chip area can be kept low. Compared to FIG. 2, an increase of only 65 percent in area is required. The invention further places less constrains on the layout than a solution using multiple interleaved global bitlines. As the global bitlines can be bypassed, they do not need to be charged/discharged before each read operation and the power consumption can be reduced significantly. Further, the time for a read operation is reduced, as there is no need for a charge or discharge of all the global and local bitlines before each read operation.

It will be apparent to those skilled in the art that various modifications and variations can be made to the structure of the present invention without departing from the scope or the spirit of the invention. In view of the foregoing, it is intended that the present invention covers modifications and variations of this invention provided they fall within this scope of the following claims and their equivalence.

What is claimed is:

1. A method for reading a memory cell, wherein the memory cell comprises two source/drain regions and a gate, wherein the source/drain regions are each connected to a respective local bitline, and, wherein one of the source/drain regions of a neighboring memory cell is connected to one of the local bitlines, the other source/drain region of the neighboring memory cell is connected to another local bitline, the method comprising:
    connecting the local bitline that connects the source/drain region of the memory cell and the source/drain region of the neighboring memory cell to a first global bitline;
    connecting the local bitline that connects the other source/drain region of the memory cell to a second global bitline;
    connecting the local bitline that connects the other source/drain region of the neighboring memory cell to one of a plurality of local power rails;
    applying a gate potential to the gate of the memory cell;
    applying a potential to the first global bitline and applying another potential to the second global bitline; and
    measuring the current flowing through the first global bitline.

2. The method according to claim 1, wherein the potential of the local power rail is kept at a fixed level.

3. The method according to claim 2, wherein the potential of the local power rail is based on the potential applied to the first global bitline.

4. The method according to claim 1, wherein further memory cells and further local bitlines are connected to the memory cell and the neighboring memory cell to form a virtual ground array, wherein the further memory cell that has one of its source/drain regions connected to the same local bitline as the memory cell has its other local bitline that connects its other source/drain region connected to a local power rail.

5. The method according to claim 1, wherein all the local bitlines except for the local bitlines that are connected to the first global bitline and the second global bitline are connected to one of the plurality of local power rails.

6. A non-volatile semiconductor memory comprising:
a plurality of memory cells connected to a plurality of local bitlines to form a virtual ground array;
a plurality of global bitlines;
a plurality of first switching elements for connecting each of the local bitlines to one of the global bitlines;
a plurality of local power rails; and
a plurality of second switching elements for connecting the local bitlines to one of the local power rails.

7. The semiconductor memory according to claim 6, further comprising a control unit for controlling the first switching elements and the second switching elements.

8. The semiconductor memory according to claim 7, wherein the first switching elements and the second switching elements operate independently from each other.

9. The semiconductor memory according to claim 8, wherein the control unit operates the first switching elements and the second switching elements so that each of the local bitlines is either connected to one of the global bitlines or to one of the local power rails or is neither connected to a global bitline nor a local power rail.

10. The semiconductor memory according to claim 9, wherein the control unit operates the first switching elements so that the local bitlines connecting a memory cell that is to be read are connected to two respective global bitlines.

11. The semiconductor memory according to claim 10, wherein the control unit operates the second switching elements so that the local bitlines not connecting the memory cell that is to be read are connected to one of the local power rails.

12. The semiconductor memory according to claim 6, wherein the local power rails are connected to a fixed potential.

13. The semiconductor memory according to claim 12, wherein the fixed potential is related to a potential that is applied to one of the global bitlines connected by the first switching elements while reading a memory cell.

14. The semiconductor memory according to claim 13, wherein the fixed potential is based on the potential of the global bitline through which a current that is measured to determine the state stored in the memory cell is flowing.

15. The semiconductor memory according to claim 12, wherein the local power rails are formed in a metallization layer that is the same metallization layer as the local bitlines or wordlines.

16. The semiconductor memory according to claim 12, wherein the local power rails are connected to a wordline decoder.

17. The semiconductor memory according to claim 12, wherein each local power rail comprises a plurality of power rails that are connected in parallel.

18. The semiconductor memory according to claim 6, wherein the local power rails are connected by bitlines that are formed in the same layer as the global bitlines.

19. The semiconductor memory according to claim 18, wherein each local power rail comprises a plurality of power rails that are connected in parallel by the bitline connecting the local power rails.

20. The semiconductor memory according to claim 18, wherein the bitlines connecting the local power rails are connected to sense amplifiers.

21. The semiconductor memory according to claim 18, wherein the bitlines connecting the local power rails are connected to a bitline decoder.

22. The semiconductor memory according to claim 6, wherein the local power rails are connected to a fixed potential and wherein the value of the fixed potential depends on whether memory cells are to be read, written or erased.

23. The semiconductor memory according to claim 6, wherein the memory cells comprise nitride read only memory cells.

24. A non-volatile semiconductor memory comprising:
a plurality of memory cells connected to a plurality of local bitlines to form a virtual ground array;
a plurality of global bitlines;
a plurality of first switching elements for connecting each of the local bitlines to one of the global bitlines;
a plurality of local power rails;
a plurality of second switching elements for connecting the local bitlines to one of the local power rails; and
means for controlling the first switching elements and the second switching elements.

* * * * *